(12) United States Patent
Wang et al.

(10) Patent No.: US 9,171,720 B2
(45) Date of Patent: Oct. 27, 2015

(54) HARDMASK SURFACE TREATMENT

(71) Applicant: Rohm and Haas Electronic Materials LLC, Marlborough, MA (US)

(72) Inventors: Deyan Wang, Hudson, MA (US); Peter Trefonas, III, Medway, MA (US); Jieqian Zhang, Southborough, MA (US); Peng-Wei Chuang, Natick, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 302 days.

(21) Appl. No.: 13/745,752

(22) Filed: Jan. 19, 2013

(65) Prior Publication Data

US 2014/0202632 A1    Jul. 24, 2014

(51) Int. Cl.
| | |
|---|---|
| *H01L 21/027* | (2006.01) |
| *B05D 1/00* | (2006.01) |
| *B05D 1/26* | (2006.01) |
| *B05D 1/28* | (2006.01) |
| *B05D 1/30* | (2006.01) |
| *B05D 1/02* | (2006.01) |
| *B05D 1/18* | (2006.01) |
| *B05D 3/02* | (2006.01) |
| *B05D 7/16* | (2006.01) |
| *H01L 21/033* | (2006.01) |
| *H01L 21/3105* | (2006.01) |

(52) U.S. Cl.
CPC ............ *H01L 21/0271* (2013.01); *B05D 1/005* (2013.01); *B05D 1/02* (2013.01); *B05D 1/18* (2013.01); *B05D 1/26* (2013.01); *B05D 1/28* (2013.01); *B05D 1/30* (2013.01); *B05D 3/02* (2013.01); *B05D 7/16* (2013.01); *H01L 21/0332* (2013.01); *H01L 21/3105* (2013.01)

(58) Field of Classification Search
None
See application file for complete search history.

(56) References Cited

U.S. PATENT DOCUMENTS

| | | | |
|---|---|---|---|
| 6,136,501 | A | 10/2000 | Trefonas et al. |
| 6,303,270 | B1 | 10/2001 | Flaim et al. |
| 6,740,469 | B2 | 5/2004 | Krishnamurthy et al. |
| 7,364,832 | B2 | 4/2008 | Sun et al. |
| 7,457,507 | B2 | 11/2008 | Kuramoto et al. |
| 7,968,268 | B2 | 6/2011 | Wang |
| 8,927,439 | B1 | 1/2015 | Wang et al. |
| 2012/0164846 | A1* | 6/2012 | Ha et al. .................. 438/786 |
| 2012/0223418 | A1 | 9/2012 | Stowers et al. |
| 2013/0337179 | A1 | 12/2013 | Wang et al. |
| 2014/0087066 | A1 | 3/2014 | Wang et al. |
| 2014/0206201 | A1 | 7/2014 | Wang et al. |
| 2015/0024522 | A1 | 1/2015 | Wang et al. |

OTHER PUBLICATIONS

Babich et al., "Hardmask technology for sub-100 nm lithographic imaging," Proc. of SPIE vol. 5039 (2003) 152-165.*
Neef et al., "Effects of bak temperature and surface modifications on hardmask materials for trilayer applications," Proc. of SPIE vol. 6923 (2008), 692331-1-692331-9.*
Yubao Wang, et al, "Hybrid High Refrective Index Polymer Coatings", SPIE, 2005, vol. 5724.

* cited by examiner

*Primary Examiner* — William Phillip Fletcher, III
(74) *Attorney, Agent, or Firm* — S. Matthew Cairns

(57) ABSTRACT

Methods of treating the surface of a metal-containing hardmask used in the manufacture of semiconductors by contacting the hardmask surface with a composition capable of adjusting the water contact angle so as to substantially match that of subsequently applied organic coatings are provided.

11 Claims, 1 Drawing Sheet

Metal hardmask with surface treatment

| Dose (mJ/cm²) | 16 | 17 | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|---|---|
| CD (nm) | 56.42 | 54.25 | 47.95 | 45.82 | 43.35 | 41.8 | 39.78 | 38.23 | 37.49 | 36.2 | 34.82 | 33.35 | 32.92 | 31.74 | 31.52 | | | |

Metal hardmask without surface treatment

| Dose (mJ/cm²) | 18.8 | 19.5 | 20.2 | 20.9 | 21.6 | 22.3 | 23 | 23.7 | 24.4 | 25.1 | 25.8 | 26.5 | 27.2 | 27.9 | 28.6 | 29.3 | 30 | 30.7 |
|---|---|---|---|---|---|---|---|---|---|---|---|---|---|---|---|---|---|---|
| CD (nm) | 53.04 | 50.29 | 48.7 | 47.27 | 44.94 | 43.91 | 42.26 | 41.61 | 40.99 | 39.78 | | | | | | | | |

HARDMASK SURFACE TREATMENT

The present invention relates generally to the field of semiconductor manufacture, and more particularly to the field of hardmasks used in the manufacture of semiconductors.

With the continuous decrease in both critical dimension and pitch in 193 nm immersion lithography, the use of a hardmask in certain layers of integrated circuit fabrication has become increasingly popular, owing to the excellent etch selectivity of the hardmask materials. Certain metal hardmasks, such as titanium nitride, are commonly applied by chemical vapor deposition (CVD), onto a processed wafer. Amorphous carbon hardmask, applied through either CVD or a spin-on technique, and silicon hardmask (or silicon antireflective coating or SiARC) are among the conventional technologies in integrated circuit fabrication. Spin-on, metal hardmask is now gaining attraction in the integrated circuit industry, in part due to potential cost reductions as compared to conventional approaches, as well as for simplification of fabrication processes.

Oxymetal hardmasks are generally characterized as films containing a majority of inorganic domains with $(\text{-M-O-})_n$ linkages (oxymetal domains), where M is a metal and n>1, and may also be composed of minor amounts of other elements, such as carbon. Other hardmasks, such as mixed domain hardmasks, contain both oxymetal domains and metal nitride domains. Typically, oxymetal hardmasks may contain one or more metals, such as Hf, Zr, Ti, W, Al, Ta and Mo. The etch resistance of oxymetal domain-containing hardmask films is dependent, in part, on the particular metal used as well as the level of $(\text{-M-O-})_n$ domains present, with an increased level of such domains providing greater etch resistance.

A cured oxymetal hardmask film often has a much higher surface energy (or lower water contact angle) than that of a subsequently applied organic layer, such as a photoresist. Such a mismatch of surface energy causes poor adhesion between the oxymetal hardmask layer and the subsequently applied organic layer. In the case of a subsequently applied photoresist layer, such mismatch in surface energy results in severe pattern collapse.

Surface treatments are known in semiconductor manufacture. For example, silicon or silicon oxide surfaces are often treated with hexamethyldisilazane (HMDS) to improve adhesion to an organic layer coated on them. However, treatment of an oxymetal hardmask with HMDS does not work effectively to prevent pattern collapse in subsequently applied photoresists. Accordingly, there remains a need for an effective surface treatment for oxymetal hardmasks that reduces the water contact angle mismatch between the metal hardmask and a subsequently applied organic layer, such as a photoresist. These needs and others have been met by the following invention.

The present invention provides a process for treating a surface of an oxymetal hardmask layer comprising inorganic domains having $(\text{-M-O-})_n$ linkages, where M is a Group 3 to Group 14 metal and n>1 comprising: contacting a surface of the hardmask with a surface treating composition to coat the hardmask surface, wherein the surface treating composition comprises an organic solvent and a surface treating agent comprising a surface treating moiety. Such treatment changes (lowers) the hardmask surface energy such that it is substantially matched to a subsequently applied organic layer. Preferably, the hardmask layer is disposed on an electronic device substrate. It is preferred that the oxymetal hardmask layer comprises a majority of inorganic domains having $(\text{-M-O-})_n$ linkages, where M is a Group 3 to Group 14 metal and n>1.

Prior to contact with the surface treating composition, the hardmask surface has a first water contact angle, and has a second water contact angle after such contact, where the second water contact angle is greater than the first water contact angle. Preferably, the second water contact angle is $\geq 55°$, more preferably from 55 to 70°, and yet more preferably from 60 to 70°.

Also provided by the present invention is an oxymetal hardmask layer disposed on an electronic device substrate, the hardmask layer comprising a majority of inorganic domains having $(\text{-M-O-})_n$ linkages, where M is a Group 3 to Group 14 metal and n>1, and having a surface having a water contact angle of $\geq 55°$. Preferably, the water contact angle is from 55 to 70°, and yet more preferably from 60 to 70°.

The present invention further provides a method of forming a patterned hardmask comprising: providing a substrate having an oxymetal hardmask layer; coating the hardmask surface with a surface treating composition comprising an organic solvent and a surface treating agent comprising a surface treating moiety chosen from protected hydroxyl and protected carboxyl; subjecting the surface treating composition coating to conditions sufficient to form a hardmask layer having a pattern of first regions of relatively lower surface energy and second regions of relatively higher surface energy. It is preferred that the first regions have a static water contact angle of $\geq 55°$. It is also preferred that the second regions have a static water contact angle of $\leq 50°$.

FIG. 1 shows a critical dimension versus dose response for a photoresist layer disposed on an oxyhafnium hardmask layer treated with a surface treating composition of the invention compared with a photoresist layer on an oxyhafnium hardmask layer without such surface treatment.

As used throughout this specification, the following abbreviations shall have the following meanings, unless the context clearly indicates otherwise: ca.=approximately; °C.=degrees Celsius; g=grams; mg=milligrams; mmol=millimoles; L=liters; mL=milliliters; µL=microliters; mJ=millijoules; cm=centimeters; nm=nanometers; Å=angstroms; Et=ethyl; i-Pr=iso-propyl; n-Bu=n-butyl; t-Bu=tert-butyl; sec.=seconds; min=minutes; and rpm=revolutions per minute. All amounts are percent by weight (wt %) and all ratios are molar ratios, unless otherwise noted. All numerical ranges are inclusive and combinable in any order, except where it is clear that such numerical ranges are constrained to add up to 100%.

As used herein, "oxymetal hardmask" refers to any metal hardmask comprising $(\text{-M-O-})_n$ domains, where M is a metal and n is an integer >1, and includes both oxymetal hardmasks having a majority of $(\text{-M-O-})_n$ domains and mixed domain hardmasks having both metal nitride domains and $(\text{-M-O-})_n$ domains. Oxymetal hardmasks may optionally include one or more other elements such as carbon, which are preferably present in a relatively minor amount as compared to the $(\text{-M-O-})_n$ domains. "Domain", as used herein, means a compact crystalline, semi-crystalline, or amorphous region formed by corresponding blocks of certain linkages, such as $(\text{-M-O-})_n$ linkages. The term "copolymer" refers to a polymer of 2 or more different monomers. "(Meth)acrylate" refers to both acrylate and methacrylate, and "(meth)acrylic" refers to both acrylic and methacrylic. As used herein, the term "pendant group" refers to a group attached to, but does not form a part of, the polymer backbone. The term "oligomer" refers to dimers, trimers, tetramers and other relatively low molecular weight materials that may be capable of further curing. The term "polymer" includes the term "oligomer." "Alkyl" refers to linear, branched and cyclic alkyl.

Surface treating compositions of the present invention used to treat an oxymetal hardmask surface comprise an organic solvent and a surface treating agent, where the surface treating agent comprises one or more surface treating moieties. A wide variety of organic solvents may suitably be used, provided that the surface treating agent is soluble in the solvent or mixture of solvents selected. Such solvents include, but are not limited to, aromatic hydrocarbons, aliphatic hydrocarbons, alcohols, lactones, esters, glycols, and glycol ethers. Mixtures of organic solvents may be used. Exemplary organic solvents include, without limitation, toluene, xylene, mesitylene, alkylnaphthalenes, 2-methyl-1-butanol, 4-methyl-2-pentanol, gamma-butyrolactone, ethyl lactate, 2-hydroxyisobutyric acid methyl ester, propylene glycol methyl ether acetate, and propylene glycol methyl ether. Suitable solvents of the invention have a relatively higher vapor pressure than the surface treating agent, such that the solvent may be removed from the surface of the hardmask leaving behind the surface treating agent. It is preferred that the organic solvents do not have free carboxylic acid groups or sulfonic acid groups.

A wide variety of surface treating agents may be used in the present surface treating compositions. Such surface treating agents may be polymeric or non-polymeric, and comprise one or more surface treating moieties. Exemplary surface treating moieties include hydroxyl (—OH), thiol (—SH), carboxyl (—CO$_2$H), betadiketo (—C(O)—CH$_2$—C(O)—), protected carboxyl, and protected hydroxyl groups. While amino groups will work, it is preferred that the surface treating agents are free of amino groups, and preferably free of nitrogen, as such groups may adversely affect the function of subsequently applied coatings such as chemically amplified photoresists. Preferred surface treating moieties include hydroxyl, carboxyl, betadiketo, protected carboxyl, and protected hydroxyl groups, more preferably hydroxyl, carboxyl, protected carboxyl, and protected hydroxyl groups, and yet more preferably hydroxyl, carboxyl and protected carboxyl groups.

Protected carboxyl groups are any groups which are cleavable under certain conditions to yield a carboxyl group. Such protected carboxyl groups may be cleaved by heat, acid, base or a combination thereof, preferably by heat, acid or a combination thereof, and more preferably by heat. Exemplary protected carboxyl groups include esters, such as benzyl esters and esters having a quaternary carbon bonded directly to the alkoxy oxygen of the ester group. It is preferred that the protected carboxyl group is an ester having a quaternary carbon bonded directly to the alkoxy oxygen of the ester group, and more preferably the ester has the formula Y—C(O)—O—CR'R"R''', where Y is an organic residue, and each of R', R" and R''' are independently chosen from C$_{1-10}$alkyl. Preferred protected carboxyl groups include, without limitation: tert-butyl esters; 1-alkylcyclopentyl esters such as 1-methylcyclopentyl esters and 1-ethylcyclopentyl esters; 2,3-dimethyl-2-butyl esters; 3-methyl-3-pentyl esters; 2,3,3-trimethyl-3-butyl esters; 1,2-dimethylcyclopentyl esters; 2,3,4-trimethyl-3-pentyl esters; 2,2,3,4,4-pentamethyl-3-pentyl esters; and adamantyl esters such as hydroxyadamantyl esters and C$_{1-12}$alkyladamantyl esters. Each of the aforementioned protected carboxyl groups can be cleaved by one or more of heat, acid or base. Preferably, the protected carboxyl groups are cleaved using heat, acid or a combination of heat and acid, and more preferably by heat. Protected carboxyl groups may be cleaved at a pH of ≤4, and preferably ≤1. Such protected carboxyl groups may be cleaved at a temperature of ≤125° C., such as from room temperature to 125° C., when exposed to a pH of ≤4, such as from 1 to 4. Alternatively, when the protected carboxyl group is an ester having a quaternary carbon bonded directly to the alkoxy oxygen of the ester group, it can be cleaved by heating to a suitable temperature, such as ≥125° C., preferably from 125 to 250° C., and more preferably from 150 to 250° C. Protected carboxyl group is an ester having a quaternary carbon bonded directly to the alkoxy oxygen of the ester group may be cleaved by heating at a variety of pH values, such as from 6 to 8. Such protected carboxyl groups and their conditions of use and deprotection are well-known in the art. For example, U.S. Pat. No. 6,136,501 discloses various protected carboxyl groups comprising ester groups having a quaternary carbon bonded directly to the alkoxy oxygen of the ester group.

Protected hydroxyl groups are any group which is cleavable under certain conditions to yield a hydroxyl group. Such protected hydroxyl groups may be cleaved by heat, acid, base or a combination thereof, and preferably by heat. Exemplary protected hydroxyl groups include: ethers such as methoxymethyl ethers, tetrahydropyranyl ethers, tert-butyl ethers, allyl ethers, benzyl ethers, tert-butyldimethylsilyl ethers, tert-butyldiphenylsilyl ethers, acetonides, and benzylidene acetals; and esters such as pivalic acid esters and benzoic acid esters; and carbonates such as tert-butylcarbonate. Each of the aforementioned protected hydroxyl groups can be cleaved by heat and/or under acidic or alkaline conditions. More preferably, the protected hydroxyl groups are cleaved using acid or a combination of acid and heat. For example, these protected hydroxyl groups can be cleaved at a pH of ≤4 and preferably ≤1. Such protected hydroxyl groups may be cleaved at room temperature when exposed to a pH in the range of 1 to 4. Alternatively, protected hydroxyl groups, such as carbonates, may be cleaved by heating, such as from 100 to 250° C. Such protected hydroxyl groups, and their conditions of use, are well-known in the art.

The present surface treating agents may be polymeric or non-polymeric, and are preferably polymeric. The surface treating agent comprises at least one surface treating moiety. Polymeric surface treating agents comprise one or more of: pendant groups comprising one or more surface treating moieties, terminal groups comprising one or more surface treating moieties, and a polymer backbone comprising one or more surface treating moieties. It is preferred that polymeric surface treating agents comprise pendant groups comprising the surface treating moiety, terminal groups comprising the surface treating moiety, or a combination thereof, and more preferably, the polymeric surface treating agent comprises pendant groups comprising the surface treating moiety. Polymeric surface treating agents typically have a molecular weight of ≤50,000 Daltons, preferably ≤30,000 Daltons, more preferably ≤25,000 Daltons, and even more preferably ≤20,000 Daltons. Typically, the polymeric surface treating agents have a molecular weight of from 500 to 50,000 Daltons, preferably from 500 to 30,000, more preferably from 500 to 25,000, and yet more preferably from 750 to 20,000 Daltons.

Any polymer comprising surface treating moieties may suitably be used as the surface treating agent, provided that the monomer comprising the surface treating moiety is present in an amount of ≤10 mol %, preferably ≤8 mol %, and more preferably ≤5 mol %, based on the total moles of the monomers used to form the polymer. Accordingly, polymeric surface treating agents will comprise monomers containing one or more surface treating moieties as well as monomers that do not comprise surface treating moieties. In one preferred embodiment, the polymeric surface treating agent comprises ethylenically unsaturated monomers as polymerized units. It is further preferred that the polymeric surface treating agent comprises as polymerized units one or more monomers chosen from (meth)acrylate monomers and vinylaromatic monomers, such as styrene monomers. Each of the (meth)acrylate monomers and vinylaromatic monomers may optionally be substituted with one or more surface treating moieties.

Preferred monomers comprising one or more surface treating moieties include, without limitation, (meth)acrylic acid, hydroxy-substituted (meth)acrylate esters, (meth)acrylate esters having a quaternary carbon bonded directly to the alkoxy oxygen of the ester group, and hydroxystyrene monomers. Both methacrylic acid (MA) and acrylic acid (AA) monomers each contain a carboxyl group as the surface treating moiety. Hydroxystyrene monomers contain a hydroxyl group as the surface treating moiety. Preferred hydroxy-substituted (meth)acrylate ester monomers are alkyleneglycol (meth)acrylates, and hydroxyalkyl (meth)acrylate monomers substituted with one or more hydroxyl groups in the alkyl radical, especially those where the hydroxyl group is found at the β-position (2-position) in the alkyl radical. Suitable alkyleneglycol (meth)acrylates have the general formula HO-(Alk-O)$_p$—C(O)—CHR$^a$=CH2, where Alk is an alkylene group, p=1-100, and R$^a$=H or CH$_3$, preferably p=1-25, and more preferably p=1-10. In such alkyleneglycol (meth)acrylates, the alkylene glycol moiety is typically derived from ethylene glycol, propylene glycol, 1,3-propane diol, butylene glycol, and 1,4-butane diol. Preferred alkylene glycol (meth)acrylates include monoalkylene glycol (meth)acrylates such as ethyleneglycol (meth)acrylate and propyleneglycol (meth)acrylate, as well as poly(alkyleneglycol) (meth)acrylates such as diethylneglycol (meth)acrylate, triethyleneglycol (meth)acrylate, dipropyleneglycol (meth)acrylate, and tripropyleneglycol (meth)acrylate. Preferred hydroxyalkyl (meth)acrylate monomers are those in which the hydroxy-substituted alkyl group is a branched or unbranched C$_{2-6}$alkyl. Preferred hydroxyalkyl (meth)acrylate monomers include, but are not limited to: 2-hydroxyethyl methacrylate (HEMA), 2-hydroxyethyl acrylate (HEA), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, HEA, 1-methyl-2-hydroxyethyl methacrylate, 2-hydroxypropyl methacrylate and mixtures thereof. A mixture of the latter two monomers is commonly referred to as "hydroxypropyl methacrylate" (HPMA). It will be appreciated by those skilled in the art that any of the above hydroxy-group containing monomers may have its hydroxy-group protected with any suitable group, such as those described above. Suitable (meth)acrylate esters having a quaternary carbon bonded directly to the alkoxy oxygen of the ester group (that is, (meth)acrylic acid having a protected carboxyl group) include (meth)acrylate esters of any of the protecting groups disclosed in U.S. Pat. No. 6,136,501, adamantyl (meth)acrylate esters, tert-butyl (meth)acrylate, and the like. Preferred (meth)acrylate esters having a quaternary carbon bonded directly to the alkoxy oxygen of the ester group include: tert-butyl (meth)acrylate, 1-methylcyclopentyl (meth)acrylate, 1-ethylcyclopentyl (meth)acrylate, 2,3-dimethyl-2-butyl (meth)acrylate, 3-methyl-3-pentyl (meth) acrylate, 2,3,3-trimethyl-3-butyl (meth)acrylate, 1,2-dimethylcyclopentyl (meth)acrylate, 2,3,4-trimethyl-3-pentyl (meth)acrylate, 2,2,3,4,4-pentamethyl-3-pentyl (meth)acrylate, and adamantyl (meth)acrylates including C$_{1-10}$alkyladamantyl (meth)acrylates.

Suitable monomers that do not contain a surface treating moiety useful in forming the surface treating agent are alkyl (meth)acrylate esters and vinylaromatic monomers. Preferred alkyl (meth)acrylate monomers include, but are not limited to: methyl (meth)acrylate, ethyl (meth)acrylate, propyl (meth)acrylate, butyl (meth)acrylate, ethylhexyl (meth) acrylate, cyclopentyl (meth)acrylate, and cyclohexyl (meth) acrylate, and more preferably methyl methacrylate (MMA), methyl acrylate (MA), ethyl methacrylate (EMA), n-propyl methacrylate (PMA), n-butyl methacrylate (BMA), butyl acrylate (BA), ethylhexyl methacrylate (EHMA), ethylhexyl acrylate (EHA), cyclopentyl methacrylate, and cyclohexyl methacrylate. Preferred vinylaromatic monomers that do not contain a surface treating moiety are styrene and C$_{1-12}$alkylstyrenes, and more preferably styrene and C$_{1-6}$alkylstyrenes. Exemplary C$_{1-12}$ alky styrenes include, but are not limited to: such as α-methylstyrene, β-methylstyrene, 4-methylstyrene, 2-methylstyrene, α-ethylstyrene, and 4-ethylstyrene.

Polymeric surface treating agents of the invention typically comprise one or more monomers comprising one or more surface treating moieties in an amount of ≤10 mol %, preferably ≤8 mol %, and more preferably ≤5 mol %, based on the total moles of the monomers used to form the polymer. The remainder of the polymer is composed of monomers that do not comprise surface treating moieties. Such polymeric surface treating agents are commercially available from a variety of sources, such as The Dow Chemical Company, Midland, Mich., or may be made according to various methods well-known in the art, such as by solution polymerization or emulsion polymerization. Such polymers may be used with or without further purification.

In another preferred embodiment, the polymeric surface treating agent is a cellulose polymer. Any cellulosic material that is soluble in the organic solvent selected and comprises one or more surface treating moieties, typically hydroxyl groups, may be used in the present invention. Exemplary cellulose polymers having one or more surface treating moieties include, without limitation, cellulose, hydroxymethyl cellulose, hydroxyethyl cellulose, hydroxypropyl cellulose, hydroxypropyl methyl cellulose, hydroxyethyl methyl cellulose, ethyl hydroxyethyl cellulose, carboxymethyl cellulose, and the like. Such cellulosic polymers are readily available from a variety of commercial sources and may be used with or without further purification.

Suitable non-polymeric surface treating agents include carboxylic acids having 1, 2, 3 or more carboxyl groups and having from 6 to 50 carbon atoms, and preferably from 6 to 30 carbon atoms. Such carboxylic acids may be aliphatic, cyclic, branched, unsaturated, aromatic and/or contain one or more heteroatoms chosen from O and S. Such carboxylic acids may optionally contain one or more other surface active moieties, such as hydroxyl groups. Exemplary non-polymeric surface treating agents include, without limitation, adipic acid, suberic acid, hydroxyhexanoic acid, hydroxydecanoic acid, 2-ethyl-2-hydroxybutyric acid, hydroxycinnamic acid, and the like. Non-polymeric surface treating agents are generally commercially available or may be prepared by a variety of methods known in the art, and may be used with or without further purification.

The surface treating composition may optionally comprise one or more additives, such as thermal acid generators, photoacid generators, antioxidants, dyes, contrast agents, and the like. When the surface treating agent comprises one or more protected hydroxyl groups, it is preferred that a thermal acid generator (TAG) or a photoacid generator (PAG) be used in the composition. When the surface treating agent comprises one or more protected carboxyl groups, the use of a TAG or PAG in the composition is optional, but the use is a PAG is preferred for certain applications where a patterned hardmask surface having regions of different surface energies is desired. In general, the amount of the TAG in the surface treating composition is from 0 to 10 wt %, preferably from 3 to 8 wt %, and more preferably from 4 to 6 wt %. The amount of the PAG in the surface treating compositions is typically from 0 to 10 wt %, preferably from 3 to 8 wt %, and more preferably from 4 to 6 wt %.

TAGs are well-known in the art. In general, TAGs may be activated by heating, such as ≥90° C. and preferably from 120 to 150° C., to generate an acid which can cleave the protecting group to form the unprotected carboxyl or hydroxyl group, as the case may be. Exemplary TAGs include: nitrobenzyl tosylates such as 2-nitrobenzyl tosylate, 2,4-dinitrobenzyl tosylate, 2,6-dinitrobenzyl tosylate, and 4-nitrobenzyl tosylate; benzenesulfonates such as 2-trifluoromethyl-6-nitrobenzyl 4-chlorobenzenesulfonate, and 2-trifluoromethyl-6-nitrobenzyl 4-nitro benzenesulfonate; phenolic sulfonate esters such as phenyl, and 4-methoxybenzenesulfonate; and amine or alkyl ammonium salts of organic acids, such as triethylammonium salt of 10-camphorsulfonic acid, amine blocked dodecylbenzenesulfonic acid, and quaternary ammonium blocked triflic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Typically, the TAG will have a very low volatility at temperatures between 170 and 220° C. Examples of TAGs include those sold by King Industries, Norwalk, Conn., USA under NACURE™, CDX™ and K-PURE™ names.

PAGs are well-known in the art and are activated upon exposure to certain wavelengths of light, such as g-, h-, or i-line, 248 nm, 193 nm, or other suitable wavelength or upon exposure to a beam of electrons (e-beam) to generate an acid which can cleave the protecting group to form the unprotected carboxyl or hydroxyl group, as the case may be. Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris (p-tert-butoxyphenyl)sulfonium trifluoromethanesulfonate, triphenylsulfonium p-toluenesulfonate; nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used. Suitable PAGs are available from a variety of sources, such as from BASF (Ludwigshafen, Germany) under the IRGACURE™ brand.

The present surface treating compositions may be prepared by combining the surface treating agent, organic solvent, and any optional additives, such as a TAG or PAG, in any order that results in a single phase liquid composition. It will be appreciated by those skilled in the art that the concentration of the surface treating agent in the composition may be varied across a wide range and that the thickness of any film deposited by a spin-on technique depends on the concentration of the surface treating agent in the composition. Preferably, the surface treating agent is present in the surface treating composition in an amount of from 0.1 to 5 wt %, preferably from 0.5 to 3 wt %, and more preferably from 1 to 3 wt %, based on the total weight of the composition. It will be appreciated by those skilled in the art that higher or lower amounts of the surface treating agent may be used in the present surface treating compositions.

Hardmasks that can be treated according to the present invention include any hardmask layer comprising inorganic domains having oxymetal linkages, including mixed metal hardmasks comprising oxymetal linkages and other metal linkages such as metal nitride linkages. Such hardmasks comprise one or more metals chosen from Group 3 to Group 14, and may include the metalloid silicon. Oxymetal hardmask layers typically comprise a majority of inorganic domains having $(-M-O-)_n$ linkages, where M is a Group 3 to Group 14 metal and n is an integer >1. Mixtures of different metals may be used to prepare the hardmask layer. As used herein, M includes the metalloid silicon. Preferably, M is a metal chosen from one or more of Groups 4, 5, 6 and 13, and more preferably from Groups 4, 5 and 6. It is preferred that M is chosen from one or more of titanium, zirconium, hafnium, tungsten, tantalum, molybdenum, and aluminum, more preferably titanium, zirconium, hafnium, tungsten, tantalum, and molybdenum, and still more preferably zirconium, hafnium, tungsten, and tantalum. Preferably, n>2, more preferably n>5, and yet more preferably n>10. As the hardmask layer is typically prepared by curing a film to provide a network of metal-oxygen domains, there is no practical upper limit to the value of n. The hardmask layer may also comprise a minority of domains having -M-OH, -M-O—C— or -M-O—X— linkages, where M is as defined above and where X may be an element other than H, C or M.

Oxymetal hardmask layers are typically formed on a substrate, such as an electronic device substrate, by disposing on an oxymetal hardmask precursor (an organo-metal compound) on the substrate surface. A variety of methods are known for forming oxymetal hardmask layers. For example, U.S. Pat. No. 7,364,832 discloses wet developable protective layer obtained by depositing on a substrate a layer of a composition containing a metal-oxygen polymer of the formula (1)

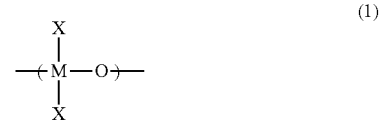

where each X is independently selected from light attenuating moieties, diketones, $C_{2-20}$polyols and $C_{1-20}$alkoxides; and M is a Group 3 to Group 14 metal. In one embodiment it is preferred that at least one X is a diketone of the structure R—C(O)—CH$_2$—C(O)—R where each R is independently chosen from: hydrogen; $C_{1-12}$alkyl, $C_{6-20}$aryl, $C_{1-12}$alkoxy, and $C_{6-10}$-phenoxy, and more preferably both X substituents are diketones. Exemplary groups for R include $C_{1-6}$alkyl, benzyl, phenethyl, naphthyl; phenoxy, methylphenoxy, dimethylphenoxy, ethylphenoxy and phenyloxy-methyl. A preferred structure of the metal-oxygen oligomer has formula (1a)

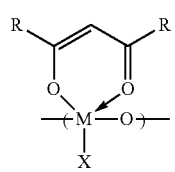

(1a)

where M, X and R are as described above. Such metal-oxygen oligomers are disclosed in U.S. Pat. No. 7,364,832. Other methods of forming metal hardmask layers are found in U.S. Pat. Nos. 6,303,270; 6,740,469; and 7,457,507, and in U.S. Pat. App. Pub. No. 2012/0223418. After curing, such metal hardmasks are composed of a majority of domains having an (-M-O—)$_n$ linkage, where n>1, preferably n>2, more preferably n>5, yet more preferably n>10, and even more preferably n>25.

Alternatively, oxymetal hardmask layers may be formed according to the procedure in U.S. patent application Ser. No. 13/624,946, which discloses forming a hardmask on an electronic device substrate by disposing a layer of an organometallic oligomer on the electronic device substrate; and curing the organometallic oligomer to form a metal-oxide layer on the electronic device substrate; wherein the organometallic oligomer is chosen from: (i) an oligomer comprising metal-containing pendant groups; (ii) an oligomer of the formula

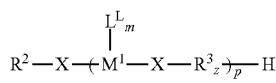

where $R^2=(C_1-C_6)$alkyl; $M^1$ is a Group 3 to Group 14 metal; $R^3=(C_2-C_6)$alkylene-X— or $(C_2-C_6)$alkylidene-X—; each X is independently chosen from O and S; z is an integer from 1-5; $L^1$ is a ligand; m refers to the number of ligands and is an integer from 1-4; and p=an integer from 2 to 25; and (iii) mixtures thereof. In yet another alternate embodiment, U.S. Pat. App. Ser. No. 61/607,035 discloses forming a metal hardmask on a substrate by disposing a layer of a composition comprising a polymer comprising, in polymerized from, at least one monomer that comprises at least one hydroxyl group; and an organometal compound comprising at least one metal selected from Ti, Zr, Hf, Co, Mn, Zn, or combinations thereof, and wherein the organometal compound is present in an amount greater than 5 weight percent, based on the total weight of the composition, followed by curing the layer.

A variety of electronic device substrates may contain a metal hardmask layer, including, without limitation: packaging substrates such as multichip modules; flat panel display substrates; integrated circuit substrates, substrates for light emitting diodes (LEDs), semiconductor wafers, polycrystalline silicon substrates, and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Particularly suitable substrates for oxymetal hardmask layers are patterned wafers, such as patterned silicon wafers, patterned sapphire wafers and patterned gallium-arsenide wafers. Such wafers may be any suitable size. Preferred wafer diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated.

The surface of a hardmask layer may be contacted with the present surface treating compositions by any suitable means, such as by spin-coating, doctor blading, curtain coating, roller coating, spray coating, dip coating, and the like. Spin-coating is preferred. In a typical spin-coating method, the present surface treating compositions are applied to the hardmask surface which is spinning at a rate of 500 to 4000 rpm for a period of 15-90 seconds to obtain a desired layer of the surface treating composition on the hardmask surface. It will be appreciated by those skilled in the art that the thickness of the surface treating composition layer may be adjusted by changing the spin speed.

Following contact with the surface treating composition and any optional solvent removal step, the surface treating agent is allowed to interact with the oxymetal hardmask surface. Such interaction may occur at ambient temperature or may be facilitated by heat. In one embodiment, the oxymetal hardmask layer is optionally heated at a desired temperature, and for a period of time, sufficient to cause at least a portion of the surface treating agent, that is, the surface treating moiety, to bond to the hardmask surface. Preferably, the hardmask layer is heated. While not wishing to be bound by theory, it is believed that as a result of this heating step the surface treating moiety binds to the surface of the oxymetal hardmask, thereby modifying the surface energy and, accordingly, the static water contact angle. Typically, the oxymetal hardmask layer is heated at a temperature of ≥100° C., preferably ≥120° C., and more preferably ≥150° C. A suitable range of temperatures for heating the oxymetal hardmask layer is from 100 to 350° C., preferably from 125 to 325° C., more preferably from 150 to 300° C., and even more preferably from 200 to 300° C. Such heating may be from 10 seconds to 5 hours, and is typically from 30 seconds to 2 hours, and preferably from 30 seconds to 30 minutes. After the surface treating agent has been allowed to interact (for example, bond) with the hardmask surface, such as after the optional heating step, any unreacted (or un-bound) surface treating agent is optionally removed by rinsing with a suitable organic solvent, and is preferably removed by rinsing. Any of the above described organic solvents useful for forming the surface treating compositions may be used in this rinsing step.

When the surface treating composition comprises an optional TAG, the hardmask layer should be heated to a temperature sufficient to activate the TAG and generate an acid. This heating step should also be sufficient to deprotect any surface active moiety (such as a carboxyl and/or hydroxyl) in the presence of the generated acid as well as facilitate any binding of the surface treating agent to the hardmask surface. When the surface treating composition comprises an optional PAG, the surface treating composition on the hardmask layer is exposed to an appropriate wavelength of light to activate the acid. Once sufficient acid is generated, the acid will deprotect any surface active moiety (such as a carboxyl and/or hydroxyl). Exposure to light may occur either prior to, during or both prior to and during the optional heating step. In an alternate embodiment, the surface treating composition comprising a PAG is exposed to an appropriate wavelength of light to activate the acid, without the optional heating step. When the surface treating composition comprises a protected carboxyl group in the form of an ester having a quaternary carbon bonded directly to the alkoxy oxygen of the ester group, the hardmask layer may be heated to a temperature sufficient to deprotect the carboxyl group and generate the corresponding carboxylic acid. However, once the surface treating moiety is liberated from the protecting group, the hardmask layer is preferably heated as described above in order to facility any binding of the of the surface treating agent to the hardmask surface. Next, a rinsing step is typically used to remove any un-bound surface treating agent. While not wishing to be bound by theory, it is believed that after such rinsing, a monolayer of the surface treating agent remains on the surface of the metal hardmask layer.

The present surface treating compositions are useful to treat the surface of oxymetal hardmask layers, as well as the surface of other hardmask materials, such as silsesquioxane-containing hardmasks, metal nitride hardmasks and silicon nitride hardmasks, or hardmasks formed by thermal treatment of coatings of organometallic polymeric materials which form films primarily comprised of silicon oxides, metal nitrides or silicon nitrides. The present surface treatment changes (lowers) the surface energy (raises the water contact angle) of the oxymetal hardmask layer so as to make the surface more compatible with a subsequently applied organic layer, such as a photoresist. As surface energy is often difficult to measure, surrogate measurements, such as water contact angles, are typically used. The determination of water contact angles is well-known, and a preferred method uses using a Kruss drop shape analyzer Model 100, using deionized ("DI") water and a 2.5 μL drop size. Before treatment, oxymetal hardmask layers having a majority of inorganic domains with $(-M-O-)_n$ linkages, where M is a metal and $n>1$, typically have a water contact angle of ≤50°, such as from 35 to 45°. Following treatment with the present compositions, the hardmask surface has a typically has a water contact angle of ≥55° and preferably ≥60°. The treated hardmask surface typically has a water contact angle of 55 to 70°, and preferably from 60 to 70°. Prior to contact with the surface treating composition, the oxy hardmask surface has a first water contact angle, and a has a second water contact angle after such contact, where the second water contact angle is greater than the first water contact angle. Preferably, the first water contact angle is ≤50°. Preferably, the second water contact angle is ≥55°, more preferably from 55 to 70°, and yet more preferably from 60 to 70°. Following treatment with the present compositions, the hardmask surface has a surface energy that substantially matches that of a subsequently applied organic layer, that is, the surface energy of the treated hardmask layer should be within 20% of the surface energy of a subsequently applied organic layer, and preferably within 10%.

Oxymetal hardmask layers are typically used to provide etch selectivity and as part of a bottom antireflective coating (BARC) stack, particularly in the manufacture of electronic devices. Following treatment of the oxymetal hardmask with the present compositions, an organic coating layer is typically deposited on the treated hardmask surface. Suitable organic layers include, without limitation, antireflective coatings, photoresists, dielectric coatings, permanent adhesives, temporary bonding adhesives, and the like. Preferably, the subsequent organic coating layer is chosen from one or more of antireflective coatings, photoresists, and dielectric coatings, and more preferably from antireflective coatings, and photoresists. Typically, a photoresist layer has a static water contact angle of 60 to 70°. Any variety of suitable organic coatings may be applied to the treated hardmask layer by any suitable method, such as those described above for the surface treating composition. Spin-coating is a preferred method. Exemplary antireflective coatings include those available under the ARC brand from Brewer Science and those available under the AR™ brand, such as AR™137 antireflectant, available from Dow Electronic Materials (Marlborough, Mass.). A wide variety of photoresists are suitable, for example, those used in 193 nm lithography, such as those sold under the EPIC™ brand available from Dow Electronic Materials. Suitable photoresists may be either positive tone development or negative tone development resists. In one preferred embodiment, a photoresist layer is disposed on the treated hardmask layer. In a second preferred embodiment, an antireflective coating layer is disposed on the treated hardmask layer, and a photoresist layer is disposed on the antireflective coating layer. Following coating on the treated hardmask layer, the organic coating layer may subjected to subsequent processing. For example, a photoresist layer is then imaged (exposed) using patterned actinic radiation, and the exposed photoresist layer is then developed using the appropriate developer to provide a patterned photoresist layer. The pattern is next transferred from the photoresist layer to the underlying hardmask layer and substrate by appropriate etching techniques known in the art, such as by plasma etching. Following etching, the photoresist layer, any antireflective coating material layer present, and the hardmask layer are removed using conventional techniques. The electronic device substrate is then processed according to conventional means.

The present invention also provides a patterned oxymetal hardmask layer having regions of different surface energies which guide the growth of self assembled di-block copolymers for forming a desired critical dimension (CD) and pitch. In particular, the present invention provides a process of forming a patterned hardmask layer comprising: providing a substrate having an oxymetal hardmask layer; coating the hardmask surface with a surface treating composition comprising an organic solvent and a surface treating agent comprising a surface treating moiety chosen from protected hydroxyl and protected carboxyl; subjecting the surface treating composition coating to conditions sufficient to form a hardmask layer having a pattern of first regions of relatively lower surface energy and second regions of relatively higher surface energy. Preferably, the surface treating composition used in this application further comprises one or more of a TAG and a PAG, and preferably comprises one or more PAGs. Such patterned oxymetal hardmask layer has a first region of a relatively lower surface energy and a second region of relatively higher surface energy, as measured by static water contact angles. Such regions of different surface energies may be obtained by selectively causing areas of the oxymetal hardmask surface to interact (or bond) with the surface treating moieties of the surface treating agent while the surface treating agent does not interact (or bond) with other areas of the hardmask surface. For example, an electron beam can be used to deprotect surface treating moieties in certain regions of the hardmask surface, after which, such regions will have a relatively lower surface energy as compared to regions of the hardmask film not exposed to the electron beam. Likewise, a laser could be used to selectively heat certain regions of the hardmask surface to deprotect surface treating moieties in those regions, after which such regions will have a relatively lower surface energy as compared to regions of the hardmask film not exposed to the laser. When an electron bean or a laser are used, the surface treating composition may optionally comprise a TAG or a PAG.

When a PAG is used in the present compositions, exposure of the surface treating composition coating on the hardmask surface to appropriate patterned actinic radiation will result in acid formation in the areas exposed to light, and can be effectively used to provide a patterned oxymetal hardmask surface. A post-exposure baking step activates acid catalyzed deprotection in the regions exposed to light to render the surface treating agent (brush polymer) with available hydroxyl and/or carboxyl surface treating moieties (functional groups). During the post-exposure bake step the generated hydroxyl or carboxyl groups react with the oxymetal domains to anchor (or bind) the surface treating agent (brush polymer) onto the oxymetal hardmask in the exposed regions of the film. A subsequent rinsing step removes any excess surface treating agent (brush polymer) and leaves a monolayer of the surface treating agent (brush polymer) in the exposed regions, and completely removes the surface treating agent (brush polymer) in the unexposed regions of the hardmask film. This process provides an imaged brush pattern on the oxymetal hardmask surface having a first region of relatively lower surface energy (in the regions exposed to light) such as having a water contact angle of 60 to 70°, and a second region having relatively higher surface energy (in regions not exposed to light) such as having a water contact angle of ≤50°. Such patterned hardmask surface may be used to order subsequently applied organic materials such as block copolymers used in directed self assembly processes. Such block copolymers contain at least two regions (or blocks) of dissimilar monomers. These block copolymers can be selected such that one block has a surface energy that substantially matches the surface energy of one of the regions of the oxymetal hardmask surface. As a result, the block copolymer will naturally align with the pattern on the hardmask surface. Such patterns of organic material on the patterned oxymetal hardmask layer may be used to produce a variety of electronic devices.

EXAMPLE 1

A hydroxyl group containing polymer (97/3 MMA/HEMA copolymer) surface treating agent was prepared as follows. A monomer/initiator feeding solution was prepared by adding the following to a glass vial: 58.2 g of methyl methacrylate (MMA), 1.80 g 2-hydroxylethyl methacrylate (HEMA) and 30.0 g propylene glycol methyl ether acetate (PGMEA). The vial was gently shaken to mix its content and then placed in an ice bath to reach temperature equilibrium with the ice bath. Next, 1.80 g of dimethyl 2,2'-azobis(2-methylpropionate) initiator (available under the tradename V-106 from Wako Pure Chemical Industries, Ltd.) was added to the vial, followed by shaking to completely dissolve the initiator. The vial was then placed back in the ice bath until needed.

A 250 mL 3-neck round-bottomed flask containing a magnetic stir bar and equipped with a thermocouple, a condenser without cooling water circulation, and a monomer/initiator feed line was set up in a heating mantel. The heating mantle was controlled by a thermal control through the thermocouple. PGMEA (60 g) was added to the flask and the temperature was brought to 99° C. with adequate stirring. Monomer/initiator solution was fed to the flask at a rate of 250 µL/13 sec. using a Hamilton dual syringe pump while maintaining the reactor temperature at 99° C. with stirring. Upon completion of the addition of the monomer/initiator solution, the flask was maintained at 99° C. for an additional 2 hours. The heat was then removed and the reaction mixture (polymer solution) allowed to cool to room temperature. The polymer solution was then used as is without further purification. The weight ratio of MMA/HEMA was 97/3.

The polymer content in the polymer solution was determined using a weight loss method in a thermal oven at ca. 110° C. for ca. 15 min. In this test, 0.103 g of the polymer solution was weighed into an aluminum pan with its tare weight predetermined. The polymer content was found to be 40.3%. The polymer solution was then diluted with PGMEA to 1 wt % to form a surface treating composition.

EXAMPLE 2

A protected carboxyl-containing polymer (95/5 MMA/ECPMA copolymer) surface treating agent was prepared according to the procedure of Example 1, except that the monomer/initiator feeding solution was prepared by adding the following to a glass vial: 28.5 g of MMA, 1.5 g of 1-ethylcycloentyl methacrylate, 15 g of PGMEA, and 0.90 g of dimethyl 2,2'-azobis(2-methylpropionate) initiator. The 250 mL round-bottom flask contained 30 g of PGMEA. The monomer/initiator feeding solution was added to the round-bottom flask at a rate of 250 µL/26 sec. The weight ratio of MMA/ECPMA was 95/5 and the polymer content was found to be 41.5%.

EXAMPLE 3

Preparation of Hf(OBu)Acetyl-diethylene Glycol Copolymer

A 500 mL three-necked flask was equipped with a reflux condenser, a mechanical stirrer and an addition funnel. To this reactor was added 100 g (0.21 mol) of Hf(OBu)$_4$ (available from Gelest Inc.). To this vigorously stirred material was added pentane-2,4-dione (42.5 g, 0.42 mol) very slowly over 6 hours. The reaction mixture was stirred overnight at room temperature. N-butanol produced during the reaction was removed under vacuum and then 800 mL of ethyl acetate was added and the reaction flask was stirred vigorously at room temperature for 30 min. This solution was filtered through a fine frit to remove any insoluble products. Remaining solvent was removed under vacuum and a pale white solid was obtained (100.4 g, 90% yield). This product, Hf(OBu)$_2$(acac)$_2$, was used without further purification.

To a 1 L three-necked flask equipped with a reflux condenser, a stirring bar and a thermal meter was added an ethyl acetate (500 mL) solution of the above product (100.4 g, 0.19 mol) and ethylene diglycol (19.4 g, 0.18 mol). The reaction mixture was refluxed at 80° C. for 24 hours. The reaction mixture was filtered through a fine frit and then dried under vacuum. The brown-white solid was washed with heptane (3×1 L) and then dried under strong vacuum for 2 hours, yielding the desired Hf(OBu)acetyl-diethylene glycol copolymer as a white powder (67 g). The product obtained had the following structure.

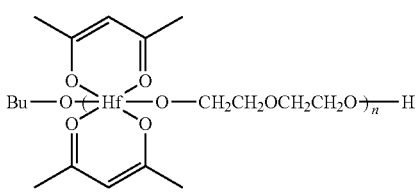

EXAMPLE 4

Preparation of Ti(OR)Acetyl-diethylene Glycol Copolymers

To a flask equipped with a Dean-Stark trap were added 50 g of Ti(OR)$_2$(acac)$_2$ (R=ethyl or isoporopyl, Tyzor AA-105, available from DuPont) and an equimolar amount of diethyleneglycol at room temperature. The mixture was heated to 125° C., stirred for 1-2 days and the distillate collected. The mixture was then cooled and quenched in heptane (500 mL). The resulting precipitate was collected and dried in vacuum to give 35 g of the desired product having the structure shown in the following formula.

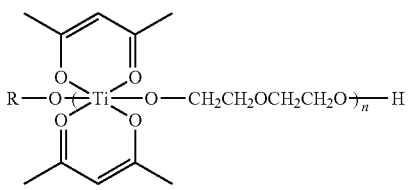

EXAMPLE 5

Preparation of Zr(OBu)Acetyl-diethylene Glycol Copolymer

Zirconium bis(acetylacetone)-bis(n-butoxide) (or Zr(acac)$_2$(OBu)$_2$), 25 wt % in toluene/butanol, was obtained from Gelest Inc. and used without further purification. The solvent was removed from 200 g of Zr(acac)$_2$(OBu)$_2$, and the residue was diluted with 250 mL ethyl acetate. To this mixture was added an equimolar amount of diethyleneglycol at room temperature and then the mixture was refluxed at 80° C. for 18 hr. Next, the reaction mixture was cooled and filtered to remove a white precipitate. The filtrate was concentrated to a small volume using a rotary evaporator and the residue quenched in heptane. The precipitate was then collected and dried in vacuum to give 20.8 g of the desired product, whose structure is shown by the following formula.

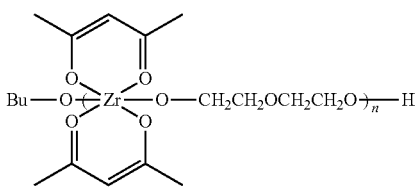

EXAMPLE 6

Surface Treatment

Solutions of each of the organometal compounds from Examples 3 to 5 were prepared in 2-methyl-1-butanol at 4 wt %. Each solution was used to spin-coat an organometal layer on bare silicon wafers at 1500 rpm, followed by curing at 200, 250 or 350° C. for 60 sec. to form metal hardmask films.

A surface treating composition of 1 wt % poly(methyl methacrylate) having hydroxyl termination on one end (PMMA-OH) in PGMEA was prepared. The PMMA-OH had a weight average molecular weight (Mw) of ca. 11,000 and was obtained from Sigma-Aldrich (St. Louis, Mo.). The surface treating composition was then spin-coated on each of the metal hardmask films at 1500 rpm and then cured at 250° C. for 8 min. The surfaces of the coated wafers were then rinsed with PGMEA for 60 sec. to remove any non-bonded PMMA-OH material. The surface contact angles of the metal hardmask layer before and after surface treatment were determined using a Kruss drop shape analyzer Model 100, using DI water and a 2.5 µL drop size. The results are reported in Table 1.

TABLE 1

| Sample | Metal Hardmask | Metal Hardmask Curing Temperature | Contact Angle Before/After Treatment |
|---|---|---|---|
| 1 | Hf | 200° C. | 48.9°/65.1° |
| 2 | Hf | 250° C. | 45.3°/64.9° |
| 3 | Hf | 350° C. | 45.4°/66.0° |
| 4 | Zr | 200° C. | 50.8°/65.1° |
| 5 | Zr | 250° C. | 46.0°/65.2° |
| 6 | Zr | 350° C. | 42.0°/64.7° |
| 7 | Ti | 200° C. | 45.3°/65.4° |
| 8 | Ti | 250° C. | 38.4°/64.9° |
| 9 | Ti | 350° C. | 38.1°/65.2° |

From the above data, it can be seen that all the hardmask films had substantially the same water contact angle (ca. 65°) after treatment, even though there was a large difference in water contact angles among the hardmask samples prior to surface treatment.

EXAMPLE 7

Surface treating agents are prepared substantially according to the procedure of Example 1 using the monomers and amounts shown in Table 2. The abbreviations in Table 2 have the following meanings: t-BuMA=tertiary-butyl methacrylate; and DMBMA=2,3-dimethyl-2-butyl methacrylate.

TABLE 2

| Surface Treating Agent | Monomer 1 (wt %) | Monomer 2 (wt %) | Monomer 3 (wt %) |
|---|---|---|---|
| A | MMA (97) | AA (3) | — |
| B | BMA (95) | HPMA (5) | — |
| C | Styrene (93) | Hydroxystyrene (7) | — |
| D | MMA (95) | AA (2) | HEMA (3) |
| E | MMA (90) | BMA (5) | HEMA (5) |
| F | MMA (95) | t-BuMA (5) | — |
| G | BA (93) | HPMA (7) | — |
| H | BA (90) | MMA (7) | DMBMA (3) |

EXAMPLE 8

A 4 wt % solution of the organometal compound from Example 3 in 2-methyl-1-butanol was used to spin-coat an organohafnium layer on bare silicon wafers at 1500 rpm, followed by curing at 350° C. for 60 sec. to form a hafnium oxide-containing hardmask film. The water contact angle of the hardmask film was determined to be 48.6° according to the procedure described in Example 6. Next, each wafer was next spin-coated with the surface treating composition from Example 1 at 1500 rpm, followed by heating at 150, 200 or 250° C. for 60 or 120 seconds, and each sample was rinsed following the heating step. After treatment, the water contact angle of each hafnium oxide-containing hardmask film was determined and the results are reported in Table 3 below.

TABLE 3

| Sample | Surface Treatment Condition | Water Contact Angle After Treatment |
|---|---|---|
| 10 | 150° C./60 sec | 63.6° |
| 11 | 150° C./120 sec | 66.6° |
| 12 | 200° C./60 sec | 66.1° |
| 13 | 200° C./120 sec | 68.0° |
| 14 | 250° C./60 sec | 67.1° |
| 15 | 250° C./120 sec | 68.4° |

EXAMPLE 9

A 4 wt % solution of the organozirconium compound from Example 5 in 2-methyl-1-butanol is used to spin-coat an organozirconium layer on bare silicon wafers at 1500 rpm. The organozirconium layer is then cured at 350° C. for 10 min. to form a zirconium oxide-containing hardmask film. Next, the surface of the hardmask film is spin-coated with a surface treating composition containing hydroxypropylcellulose (1.5 wt %) in PGME. The coated hardmask layer is heated at 200° C. for 60 to 120 sec.

EXAMPLE 10

Lithographic Test

Substrates are prepared by depositing a BARC layer on a silicon wafer substrate. The BARC layer had a film thickness of 970 Å, and was prepared by spin-coating AR™40A Bottom Antireflectant (from Dow Electronic Materials) on the silicon wafer followed by curing at 205° C. for 60 sec. An organo-hafnium solution was prepared using the organo-hafnium compound of Example 3 by dissolving it in 2-methyl-1-butanol to form a 3.6 wt % solution which also contain 5 wt % gamma-butyrolactone as a co-solvent. A hafnium hardmask layer was prepared by spin-coating a 125 Å thick layer of the organo-hafnium compound on the surface of the BARC layer on each substrate. The hafnium hardmask layer was formed by curing the organo-hafnium compound layer at 350° C. for 60 sec. One hafnium hardmask sample was used without further treatment (Comparative sample) and one hafnium hardmask sample was treated using the composition of the invention (Invention sample) as follows.

A surface treating composition was prepared by diluting the polymer solution from Example 1 with PGMEA to get a solution containing 1 wt % solids. This material was used to treat the surface of the Invention sample by spin coating at 1500 rpm followed by baking at 200° C. for 60 sec. The surface was then rinsed with a solvent mixture (70/30 w/w of PGME/PGMEA) for 50 sec. to remove any excess surface treating agent that was not bonded to the hafnium hardmask surface.

A photoresist layer (EPIC™ 2096 Photoresist from Dow Electronic Materials) was then spin-coated on each of the Comparative and Invention samples to a thickness of 950 Å and baked at a temperature of 120° C. for 60 sec. Next, a 314 Å thick film of an immersion topcoat material (OC™ 2000 from Dow Electronic Materials) was spin-coated on the surface of the photoresist layer followed by baking at 90° C. for 60 sec. The photoresist was then exposed through a mask having 40 nm line-spaces using an ASML 1900i scanner at the following exposure conditions: 1.35 NA, dipole-35, 0.98/0.86. Following exposure, the samples were baked at 95° C. for 60 sec., and then developed using a commercial developer (MF™ CD-26). The results for the metal hardmask with surface treatment (Invention sample) and without such surface treatment (Comparative sample) are seen in FIG. 1, which shows the critical dimension (CD) versus dose images. As can be seen in FIG. 1, the pattern collapse margin for the surface treated oxyhafnium hardmask (invention) is 31.5 nm whereas the pattern margin collapse for the oxyhafnium hardmask without the treatment (comparative) is 39.8 nm. Accordingly, the present hardmask surface treatment provides an improvement in adhesion of subsequently applied organic coatings, such as photoresists, as seen in the improved resolution of lines/spaces before pattern collapse as compared to a hardmask sample without such surface treatment.

EXAMPLE 11

A polymer solution was prepared by combining 0.960 g of the polymer solution from Example 2 with 19.04 g of PGMEA. A PAG stock solution was prepared by combining 0.10 g of (4-(2-(tert-butoxy)-2-oxoethoxy)phenyl)diphenyl-sulfonium perfluorobutyl sulfonate (tBuAcPDPS PFBuS) with 10 g of PGMEA. A surface treating composition was prepared by combining 10 g of the polymer solution, 1 g of the PAG stock solution and 9 g of PGMEA.

EXAMPLE 12

Solutions of each of the organohafnium compound of Examples 3 and the organozirconium compound of Example 5 were prepared by combining 0.57 g of the respective organometal compound, 0.75 g of gamma-butyrolactone, and 13.68 g of 2-methyl-1-butanol. Each solution was filtered through 0.2 μm polytetrafluoroethylene syringe filters multiple times beore being spin-coated on a bare silicon wafer at 1500 rpm. Each organoetal layer was then cured at 350° C. for 60 sec.

Next, the surface treating composition from Example 11 was spin-coated (1500 rpm) on each organometal layer. Each coated wafer was then baked (soft baked) at 90° C. for 60 sec., followed by exposure to patterned radiation (193 nm, flood exposure from 1 to 100 mJ/cm$^2$), then baked again (post-exposure bake) at 120° C. for 60 sec., and then stripped with PGMEA (single puddle for 60 sec.).

Water contact angles were measured according to the procedure in Example 6. The contact angles were measured in both the unexposed regions and in regions where the exposure energy was in the range of 30 to 50 mJ/cm$^2$. For the Hf-containing hardmask, the water contact angles in the unexposed regions ranged from 49.8 to 51.3°, and in the exposed regions the water contact angle was found to be 65.9°. For the Zr-containing hardmask, the water contact angles in the unexposed regions ranged from 49.7°, and in the exposed regions the water contact angle was found to be 65.3°.

What is claimed is:

1. A hardmask layer disposed on an electronic device substrate, the hardmask layer comprising a majority of inorganic domains having $(\text{-M-O-})_n$ linkages, where M is a Group 3 to Group 14 metal and n>1, and having a surface having a water contact angle of ≥60°.

2. A process for treating a surface of a hardmask layer comprising inorganic domains having $(\text{-M-O-})_n$ linkages, where M is a Group 3 to Group 14 metal and n>1 comprising: contacting a surface of the hardmask with a surface treating composition to coat the hardmask surface, wherein the surface treating composition comprises an organic solvent and a surface treating agent comprising one or more surface treating moieties, wherein the hardmask surface has a first water contact angle before contact with the surface treating composition, and a has a second water contact angle after such contact, where the second water contact angle is greater than the first water contact angle.

3. The process of claim 2 wherein M is chosen from titanium, zirconium, hafnium, tungsten, tantalum, molybdenum, and aluminum.

4. The process of claim 2 wherein the process further comprises the step of heating the coated hardmask surface.

5. The process of claim 4 wherein the hardmask surface after heating has a water contact angle of 60 to 70°.

6. The process of claim 4 further comprising a rinsing step after the heating step.

7. The process of claim 2 wherein the surface treating agent is polymeric and comprises one or more of pendant groups comprising the one or more surface treating moieties, terminal groups comprising the one or more surface treating moieties, or a polymer backbone comprising the one or more surface treating moieties.

8. The process of claim 2 wherein the one or more surface treating moieties are chosen from hydroxyl, thiol, carboxyl, betadiketo, protected carboxyl, and protected hydroxyl groups.

9. The process of claim 2 wherein the oligomer comprises as polymerized units a monomer chosen from (meth)acrylic acid, (meth)acrylate esters, and hydroxystyrene monomers.

10. The process of claim 2 wherein the hardmask layer is disposed on an electronic device substrate.

11. A process of forming a patterned hardmask layer comprising: providing a substrate having an oxymetal hardmask layer; coating the hardmask surface with a surface treating composition comprising an organic solvent and a surface treating agent comprising a surface treating moiety chosen from protected hydroxyl and protected carboxyl; subjecting the surface treating composition coating to conditions sufficient to form a hardmask layer having a pattern of first regions of relatively lower surface energy and second regions of relatively higher surface energy.

* * * * *